(12) United States Patent  
Zou et al.

(10) Patent No.: US 11,543,431 B2
(45) Date of Patent: Jan. 3, 2023

(54) CANTILEVER-TYPE PROBE WITH MULTIPLE METALLIC COATINGS

(71) Applicant: KLA Corporation, Milpitas, CA (US)

(72) Inventors: Hongshuo Zou, Shanghai (CN); Nanchang Zhu, Shanghai (CN); Hai-Yang You, Shanghai (CN)

(73) Assignee: KLA Corporation, Milpitas, CA (US)

( * ) Notice: Subject to any disclaimer, the term of this patent is extended or adjusted under 35 U.S.C. 154(b) by 38 days.

(21) Appl. No.: 16/858,062

(22) Filed: Apr. 24, 2020

(65) Prior Publication Data
US 2021/0333307 A1 Oct. 28, 2021
US 2022/0214375 A9 Jul. 7, 2022

(30) Foreign Application Priority Data

Jan. 13, 2020 (CN) .......................... 202010032250.9

(51) Int. Cl.
*G01R 1/067* (2006.01)
(52) U.S. Cl.
CPC ..... *G01R 1/06727* (2013.01); *G01R 1/06755* (2013.01); *G01R 1/06772* (2013.01)
(58) Field of Classification Search
CPC ............ G01R 1/06727; G01R 1/06755; G01R 1/06772
See application file for complete search history.

(56) References Cited

U.S. PATENT DOCUMENTS

| 2002/0164893 A1* | 11/2002 | Mathieu ................. H01R 13/03 439/66 |
| 2006/0030179 A1* | 2/2006 | Van Schuylenbergh ..................... H01L 24/72 439/81 |
| 2006/0082380 A1 | 4/2006 | Tanioka et al. |
| 2006/0228873 A1 | 10/2006 | Liu et al. |
| 2010/0102838 A1* | 4/2010 | Kitazume .......... G01R 1/06727 324/756.03 |

FOREIGN PATENT DOCUMENTS

| JP | 4498368 B2 | 7/2010 |
| KR | 101425701 B1 | 8/2014 |
| KR | 101624946 B1 | 5/2016 |

OTHER PUBLICATIONS

English translation of JP 4498368 B2 (Description) (Year: 2010).*
English translation of JP 4498368 B2 (Abstract) (Year: 2010).*
PCT International Search Report and Written Opinion for International Application No. PCT/US2021/014056 dated May 7, 2021, 6 pages.

* cited by examiner

*Primary Examiner* — Paresh Patel
(74) *Attorney, Agent, or Firm* — Suiter Swantz pc llo (57) ABSTRACT

A cantilever-type probe with multiple metallic coatings is disclosed. The cantilever-type probe includes at least one probe pin. A first metallic coating is disposed upon a tip of the probe pin, and a second metallic coating is disposed upon a root of the probe pin. The second metallic coating is in contact with the first metallic coating and comprises a softer (more flexible) metal than the first metallic coating.

14 Claims, 9 Drawing Sheets

CANTILEVER-TYPE PROBE WITH MULTIPLE METALLIC COATINGS

CROSS-REFERENCE TO RELATED APPLICATION

The present application claims priority to Chinese Patent Application No. 202010032250.9, filed on Jan. 13, 2020, which is incorporated herein by reference in the entirety.

TECHNICAL FIELD

The present disclosure relates generally to sensor probes and more particularly to cantilever-type probes for performing measurements on a sample substrate.

BACKGROUND

Cantilever-type probes can be used to measure film resistance and other properties of a sample substrate. For example, to perform film resistance measurements on a sample substrate, a cantilever-type probe may be used to make electrical contacts with a surface of the sample substrate in order to pass current to the sample substrate and measure voltage at the electrical contacts. The resistance is then calculated as a function of the applied current and measured voltage.

SUMMARY

A cantilever-type probe with multiple metallic coatings is disclosed in accordance with one or more illustrative embodiments of the present disclosure. In one illustrative embodiment, the cantilever-type probe includes at least one probe pin with a first metallic coating disposed upon a tip of the probe pin and a second metallic coating disposed upon a root of the probe pin. The second metallic coating may be in contact with the first metallic coating and may comprise a softer (more flexible) metal than the first metallic coating.

A sensor for measuring one or more characteristics of a sample substrate is also disclosed in accordance with one or more illustrative embodiments of the present disclosure. In one illustrative embodiment, the sensor includes a sensor base with a plurality of probe pins extending from the sensor base. The sensor may further include a first metallic coating disposed upon a tip of at least one probe pin of the plurality of probe pins and a second metallic coating disposed upon a root of the probe pin. The second metallic coating may be in contact with the first metallic coating and may comprise a softer (more flexible) metal than the first metallic coating.

A method of manufacturing a cantilever-type probe is also disclosed in accordance with one or more illustrative embodiments of the present disclosure. In one illustrative embodiment, the method includes: forming at least one probe pin; disposing a first metallic coating upon a tip of the probe pin; and disposing a second metallic coating upon a root of the probe pin. In embodiments of the method, the second metallic coating may be disposed in contact with the first metallic coating and may comprise a softer (more flexible) metal than the first metallic coating.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Cantilever-type probes can be used to measure film resistance and other properties of a sample substrate. For example, to perform film resistance measurements on a sample substrate, a cantilever-type probe may be used to make electrical contacts with a surface of the sample substrate in order to pass current to the sample substrate and measure voltage at the electrical contacts. The resistance is then calculated as a function of the applied current and measured voltage.

The probe pins of a cantilever-type probe may make contact with the surface of a sample substrate only during measurement. Before and after the measurement, the probe pins can be lifted up from the surface of the sample substrate (or the sample substrate is lowered), to form a gap safe enough to move either the cantilever-type probe and/or the sample substrate laterally for next site measurement.

The tips of the probe pins that make contact with the surface of a sample substrate may move in the x-y plane when the cantilever bends during overdrive to apply the necessary pressure for good electrical contact between the tips of the probe pins and the surface of the sample substrate. This results in a forward scratch. A reverse scratch can also occur as the cantilever-type probe is lifted up from the surface of the sample substrate, i.e., before the probe completely leaves the sample surface.

The scratching of the tips of the probe pins on the surface of the sample substrate can be limited by adjusting the landing method. The smaller the scratch, the smaller the friction of metal on tips of the probe pins. Yet, even with almost zero scratch, the contact pressure of the probe pins on the sample surface will wear the metal on the tips of the probe pins over time. It is therefore advantageous to use a harder metallic coating on the tips of the probe pins in order to increase the useful lifetime of a cantilever-type probe.

It is also noted that for enough contact pressure between the tips of the probe pins and the surface of the sample substrate, the probe pins must be able to endure a sufficient amount of bending. During contact between the tips of the probe pins and the surface of the sample substrate, the highest stress/strain through the cantilever-type probe is on the roots of the probe pins (e.g., stress/strain on the longitudinal portions that extend to the tips of the probe pins). The metal on roots of the probe pins must bear this strain, otherwise the metal will become fatigued and/or cracked. It is therefore advantageous to use a softer (more flexible) metallic coating on the roots of the probe pins so that the cantilever-type probe can endure enough bending for sufficient contact pressure (hence, good electrical contact) between the probe pins and a sample surface when measurements are performed.

Figure 1:
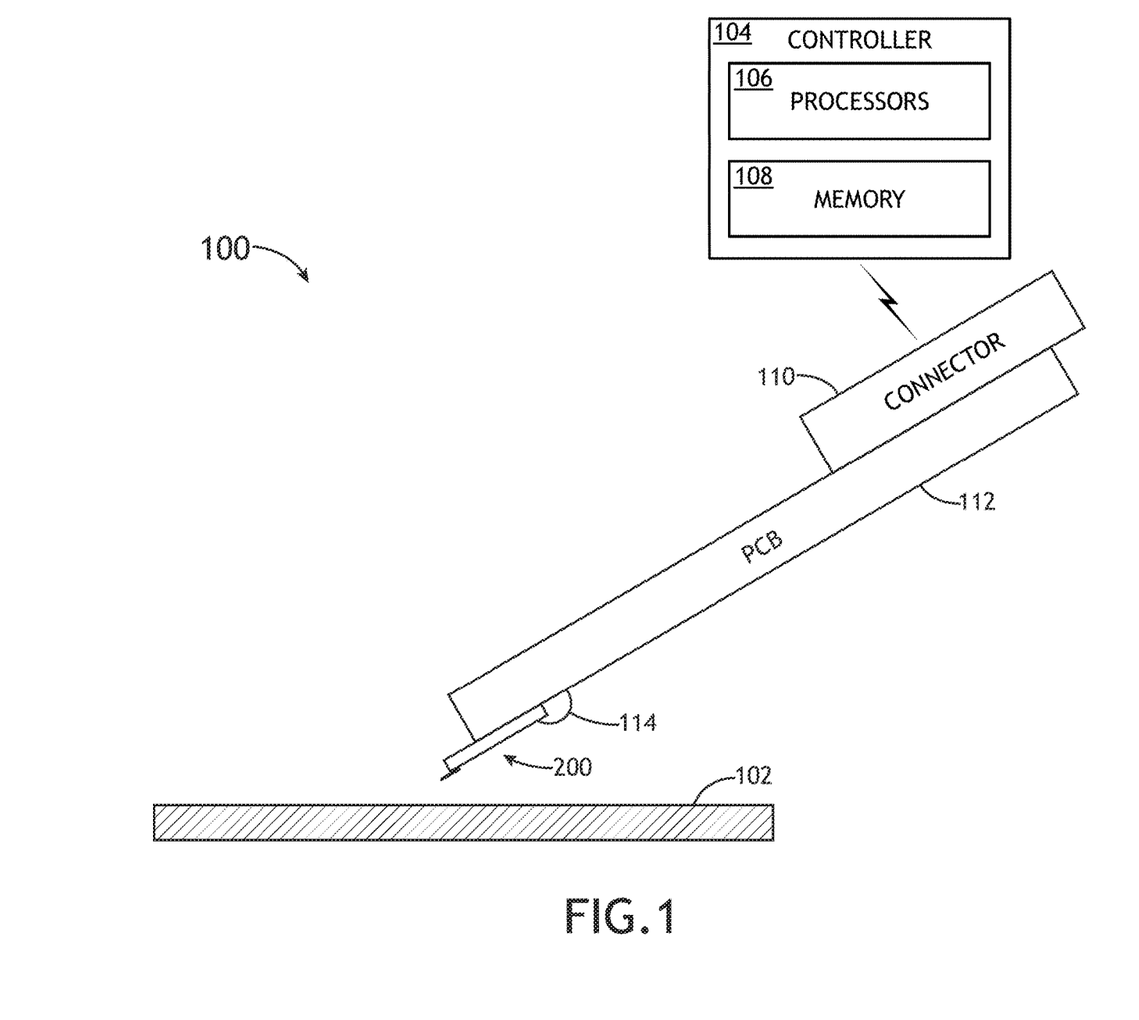
FIG. 1 is a schematic illustration of a system that includes a sensor comprising a cantilever-type probe, in accordance with one or more embodiments of the present disclosure.

FIG. 1 illustrates a system 100 for measuring one or more characteristics of a sample substrate 102 (a wafer, board, panel, reticle, or the like), in accordance with one or more embodiments of the present disclosure. In embodiments, the system 100 includes a sensor 200 comprising a cantilever-type probe configured to make one or more electrical contacts with a surface of the sample substrate 102 in order to pass current to the sample substrate 102 and measure voltage at the electrical contacts. One or more sample characteristics can then be determined based on the measured voltage. For example, the resistance (e.g., film resistance) at the surface of the sample substrate can be calculated as a function of the applied current and measured voltage.

In embodiments, the system 100 includes a controller 104 communicatively coupled to the sensor 200. In some embodiments, the controller 104 includes one or more processors 106 configured to execute program instructions maintained on a memory medium 108. In this regard, the one or more processors 106 of controller 104 may execute any of the various process steps or operations described throughout the present disclosure, such as controlling one or more actuators to reposition the sensor 200 and/or sample substrate 102, receiving electrical signals/voltage measurements from the sensor 200, calculating resistance and/or any other sample characteristics, and so forth.

The one or more processors 106 of a controller 104 may include any processing element known in the art. In this sense, the one or more processors 106 may include any microprocessor-type device configured to execute algorithms and/or instructions. In some embodiments, the one or more processors 106 may comprise a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 108.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory, a random-access memory, a magnetic or optical memory device (e.g., disk or disk drive), a magnetic tape, a solid-state drive, a flash memory device, or any combination thereof. It is further noted that memory medium 108 may be housed in a common controller housing with the one or more processors 106. In some embodiments, the memory medium 108 may be located remotely with respect to the physical location of the one or more processors 106 and controller 104. For example, the one or more processors 106 of controller 104 may access a remote memory (e.g., server), accessible through a network (e.g., internet, intranet and the like). Therefore, the above description should not be interpreted as a limitation on the present invention but merely an illustration.

In embodiments, the controller 104 is configured to communicate with the sensor 200. For example, the controller 104 can be configured to send/receive any combination of raw data (e.g., electrical signals), processed data (e.g., voltage measurements), and/or partially-processed data to/from the sensor 200.

The steps described throughout the present disclosure may be carried out by a single controller 104 or, alternatively, multiple controllers. Additionally, the controller 104 may include one or more controllers housed in a common housing or within multiple housings. In this way, any controller or combination of controllers may be separately packaged as a module suitable for integration into the system 100.

As shown in FIG. 1, the sensor 200 may be mounted or otherwise coupled to a printed circuit board (PCB) 112 configured to support the sensor 200. The controller 104 may be communicatively coupled to the sensor 200 by one or more connectors 110 (e.g., one or more cables, wires, traces, etc.) that are fixedly or removably coupled to the PCB 112. In some embodiments, the system 100 also includes one or more connectors 114 (e.g., one or more cables, wires, traces, etc.) that communicatively couple the sensor 200 to the PCB 112 so that signals/data can be transmitted from the sensor 200 to the controller 104, or vice versa, via the PCB 112.

The system 100 may further include one or more actuators for positioning the sensor 200 and/or the sample substrate 102. For example, in some embodiments, the system 100 may include one or more actuators coupled to a sample stage or chuck configured to support the sample substrate 102 and also configured to move the sample substrate 102 laterally, vertically, and/or rotationally. Additionally, or alternatively, the system 100 may include one or more actuators coupled to the sensor 200/PCB 112 and configured to move the sample substrate 102 laterally, vertically, and/or rotationally.

In embodiments, the controller 104 is configured to communicate with actuators and any other electronic components of the system 100. For example, the controller 104 can be configured to send/receive any combination of raw data (e.g., electrical signals), processed data (e.g., voltage measurements), and/or partially-processed data to/from the actuators and/or other electronic components of the system 100. In some embodiments, the controller 104 is configured to cause the one or more actuators to move the sensor 200 and/or sample substrate 102 from one measurement site to another in order to scan or perform measurements at multiple portions of the sample substrate 102.

Figure 6:
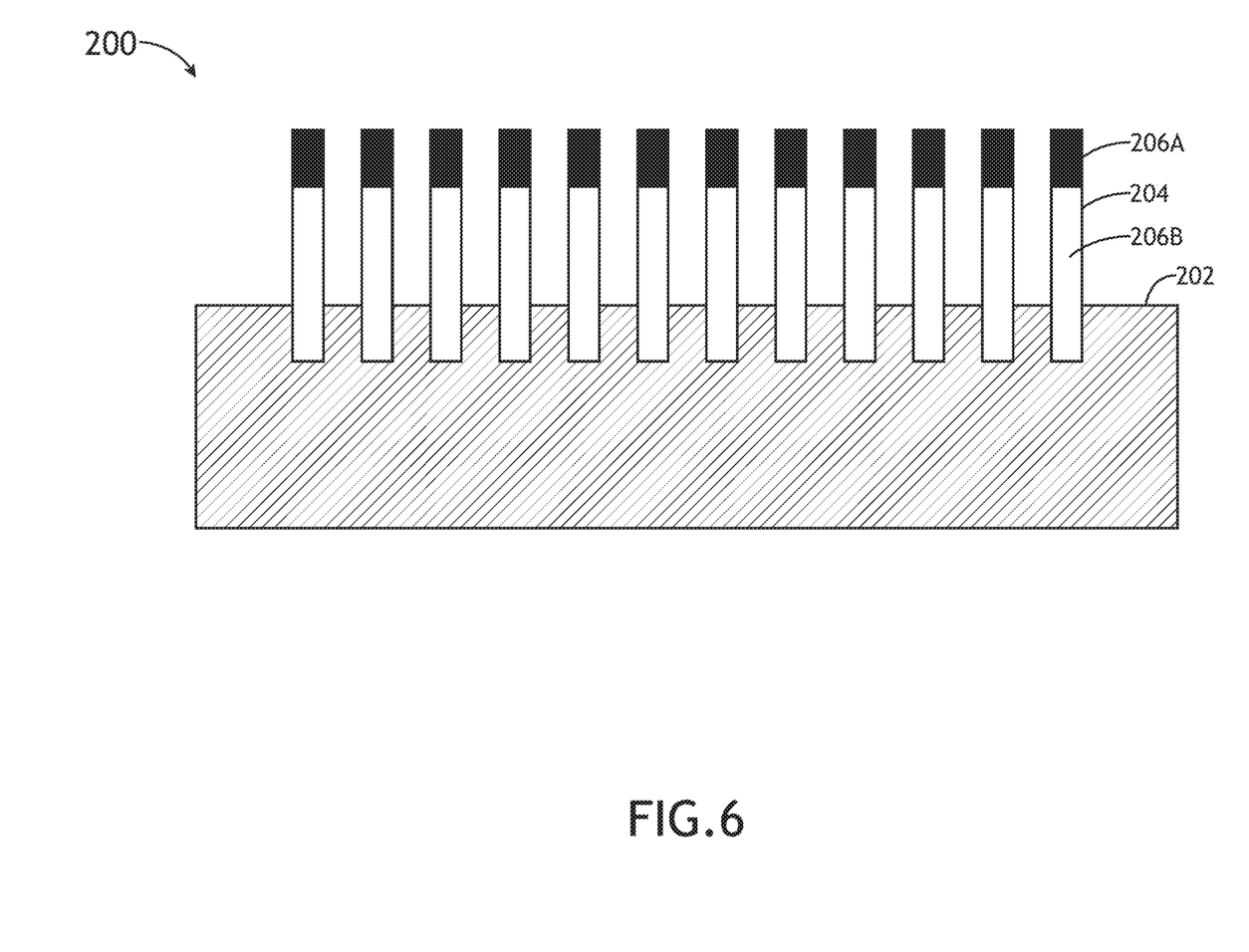
FIG. 6 is a schematic illustration of a top view a sensor comprising a cantilever-type probe with multiple metallic coatings, in accordance with one or more embodiments of the present disclosure.

Various embodiments of the sensor 200 are illustrated in FIGS. 2A through 2D. As shown in FIGS. 2A through 2D, the sensor 200 (e.g., cantilever-type probe) includes a sensor base 202 with one or more probe pins 204 extending outwardly from the sensor base 202. For example, the one or more probe pins 204 (sometimes referred to as the "cantilever") may extend out from the base by approximately 5 to 50 um (e.g., 20 um or so). FIGS. 2A through 2D show illustrative embodiments where the sensor 200 is a microscopic four-point probe (M4PP). However, the sensor 200 may have any number of probe pins 204 depending on design requirements. For example, FIG. 6 shows another illustrative embodiment where the sensor 200 is a microscopic twelve-point probe (M12PP). The sensor 200 can have an arbitrary number of (one or more) probe pins 204 without departing from the scope of this disclosure.

The sensor base 202 may be formed from silicon (Si) or silicon dioxide ($SiO_2$). For example, the sensor base 202 may be formed from (e.g., etched out of) a Si wafer and/or $SiO_2$ wafer, such as a silicon on insulator (SOI) wafer, or the like. The one or more probe pins 204 may also be formed from Si or $SiO_2$. For example, the one or more probe pins 204 may also be formed from (e.g., etched out of) a Si wafer and/or $SiO_2$ wafer, such as a SOI wafer, or the like.

Figure 2A:
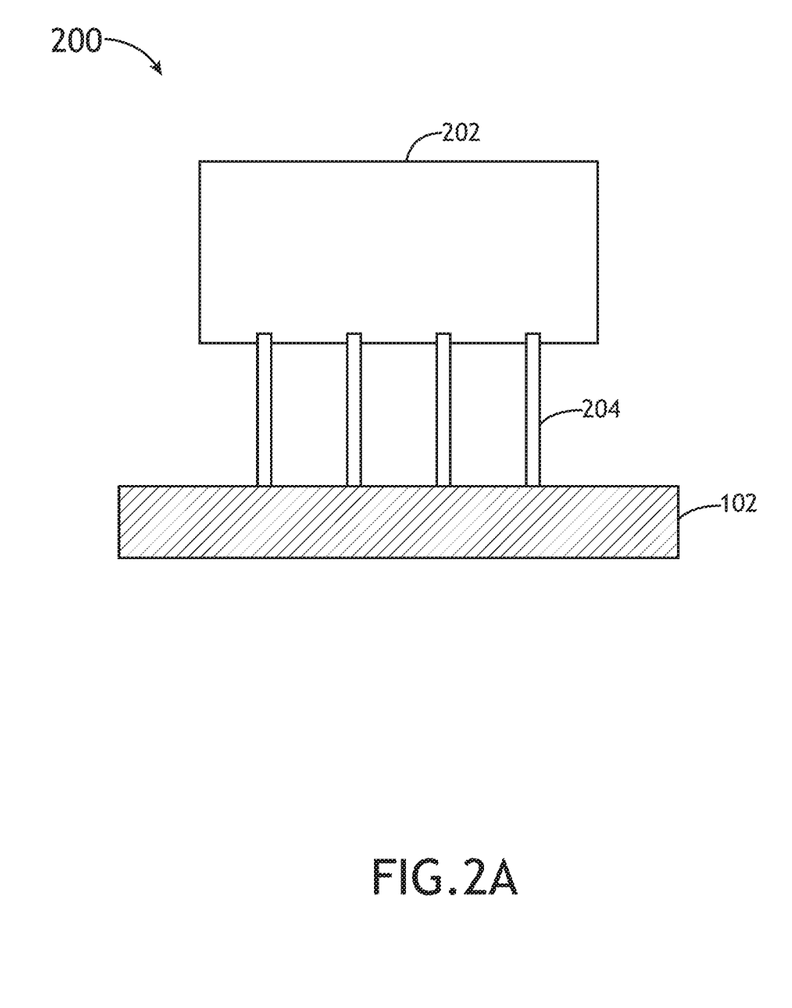
FIG. 2A is a schematic illustration of a front view a sensor comprising a cantilever-type probe, in accordance with one or more embodiments of the present disclosure.
Figure 2B:
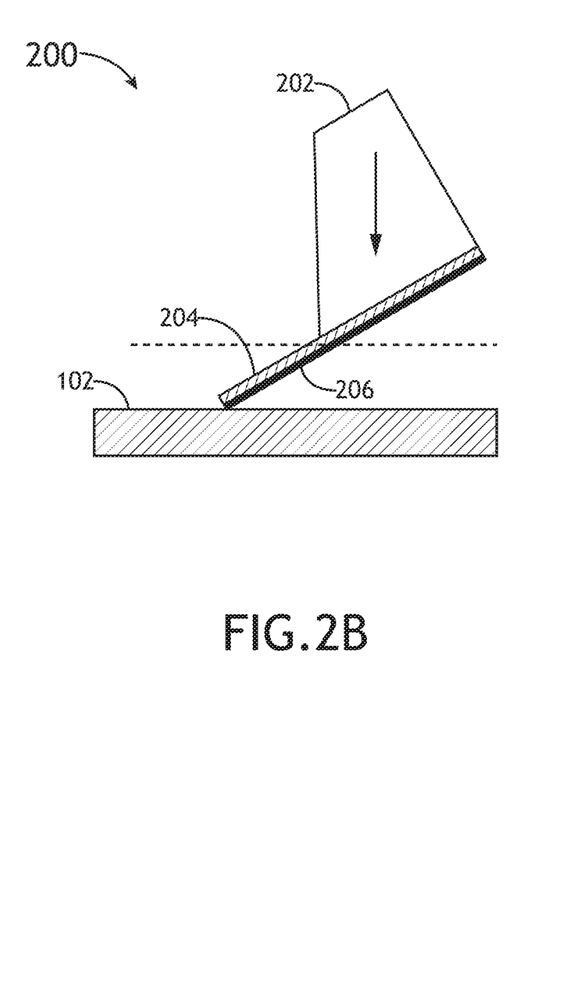
FIG. 2B is a schematic illustration of a side view a sensor comprising a cantilever-type probe, in accordance with one or more embodiments of the present disclosure.
Figure 2C:
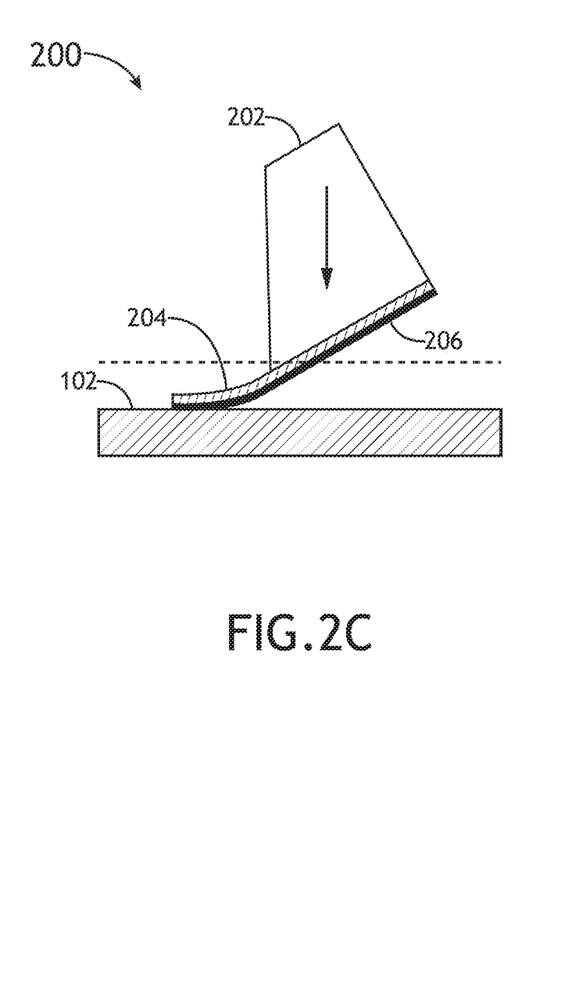
FIG. 2C is a schematic illustration of a side view a sensor comprising a cantilever-type probe when the sensor is pressed against a sample substrate to perform a measurement, in accordance with one or more embodiments of the present disclosure.
Figure 2D:
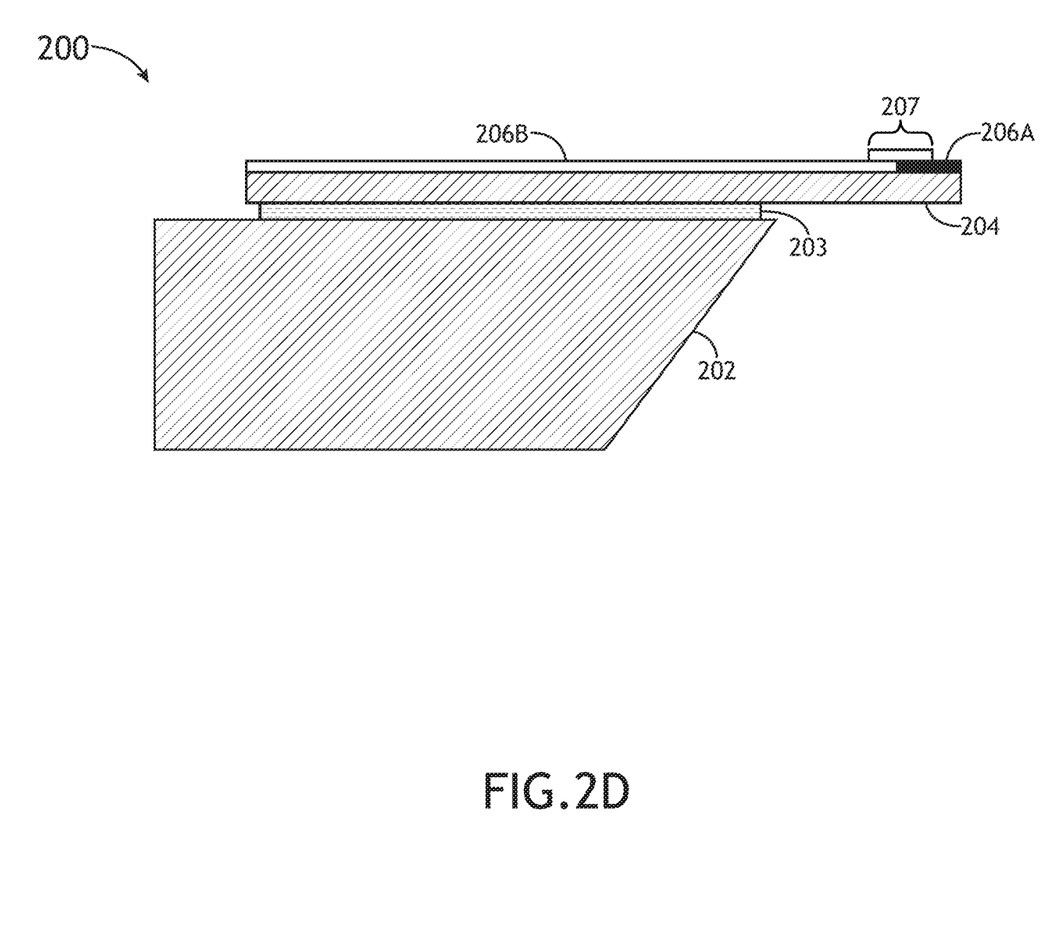
FIG. 2D is a schematic illustration of a side view a sensor comprising a cantilever-type probe with multiple metallic coatings, in accordance with one or more embodiments of the present disclosure.

In an embodiment illustrated in FIG. 2D, the sensor base 202 and the one or more probe pins 204 are formed from Si and are separated from one another by an oxide (e.g., $SiO_2$) layer 203. This may be achieved by etching the sensor base 202, oxide layer 203, and probe pins 204 out of the same SOI wafer, or alternatively, by disposing the $SiO_2$ and probe pins 204 on the sensor base 202 using any appropriate semiconductor fabrication process.

As noted above, in some embodiments, the sensor base 202 and the probe pins 204 may be formed from the same wafer and/or part of the same mold or print. In other embodiments, the probe pins 204 may be printed on, mounted to, or otherwise coupled with the sensor base 202.

FIGS. 2A and 2B show front and side views, respectively, of the sensor 200 with probe pins 204 being brought into contact with the sample substrate 102. Then, as shown in FIG. 2C, the sensor 200 may be pressed down onto the sample substrate 102 after the probe pins 204 are in contact with the surface of the sample substrate 102 in order to apply certain stress/pressure onto the sample substrate 102. This overdrive action may be necessary to achieve sufficient contact between the probe pins 204 and the surface of the sample substrate 102 to get a stable electrical signal. As noted above, metal layers 206 on the probe pins 204 may become worn and/or cracked as a result of repeated contact and/or bending. To mitigate these effects, the sensor 200 may include multiple metal layers 206 made out of different metals.

An embodiment of the sensor 200 including multiple metal layers 206 (e.g., metallic coatings 206A and 206B) is illustrated in FIG. 2D. As shown in FIG. 2D, each or some of the probe pins 204 may include a first metallic coating 206A disposed upon a tip of the probe pin 204 and a second metallic coating 206B disposed upon a root (e.g., a longitudinal portion extending to the tip) of the probe pin 204. In embodiments, the first metallic coating 206A may comprise ruthenium (Ru) and/or tungsten (W), or any other metal/metal alloy with similar physical and electrical properties. The second metallic coating 206B may comprise a softer (more flexible) metal than the first metallic coating 206A. For example, in embodiments, the second metallic coating 206B may comprise gold (Au) or any other metal/metal alloy with similar physical and electrical properties.

In embodiments, the first metallic coating 206A and the second metallic coating 206B are in contact with one another at an overlapping region 207 near the tip of the probe pin 204. For example, the second metallic coating 206B may overlap a portion of the first metallic coating 206A so that the first and second metallic coatings 206A and 206B are in contact with one another at the overlapping region 207. Alternatively, the first metallic coating 206A may overlap a portion of the second metallic coating 206B so that the first and second metallic coatings 206A and 206B are in contact with one another at the overlapping region 207. In other embodiments, the first and second metallic coatings 206A and 206B may be in non-overlapping contact with one another. For example, the metallic coatings 206A and 206B may simply be disposed adjacent to one another or the metallic coatings 206A and 206B may be fused together (e.g., at/near region 207).

When the sensor 200 is in use, the contact pressure and scratching of the probe pins 204 against the surface of the substrate 102 mostly wears the metal on tips of the probe pins (i.e., the cantilever tip), because the contact only happens at cantilever tip. Hard metal (e.g., Ru, W, or the like) is more wear-resisting than soft metal (e.g., Au, or the like) so it is advantageous to use a hard metal for the first metal coating 206A (at the tip of a probe pin 204). On the other hand, the biggest strain happens on cantilever root no matter what metal is coated on the cantilever root. Hard metal (e.g., Ru, W, or the like) may be too brittle and unable to bear much strain; however, soft metal (e.g., Au, or the like) is more flexible and capable of enduring the strain caused by bending at the roots of probe pins 204 when higher contact pressures are applied to achieve better measurement signals. For example, Au can bear more strain than Ru and is a very malleable metal, such that even a higher level of strain than 0.2% will not cut the electrical connection of Au on a cantilever root.

To prolong the lifetime and functionality of a probe pin 204, the hardness of metallic coating 206A on the tip should be enough to tolerate higher contact pressure than the metallic coating 206B on the root of the probe pin 204. Considering the thickness and conductivity of the oxide layer 203, besides the hardness of the metals, Ru and W are good candidates for metallic coating 206A, bearing much more friction (i.e., more contact counts) than traditional Au coating. Meanwhile, the metallic coating 206B on the root of the probe pin 204 should be flexible enough to tolerate bending. For example, the metallic coating 206B should be in the elastic range of the cantilever material (e.g., Si and/or $SiO_2$), so the metallic coating 206B on the root of the probe pin 204 is does not impose a restriction on the bending of the cantilever. Considering the conductivity and flexibility of the metal, Au is a good candidate for metallic coating 206B. This is validated by the use of Au in traditional M4PP indicating that Au is an appropriate coating for the cantilever root.

While various metals (e.g., Ru, W, and Au) have been provided as examples, it is contemplated that other metals or metal alloys may also serve as appropriate metals for the first and second metallic coatings 206A and 206B. Accordingly, the examples and illustrative embodiments provided herein should not be construed as limitations on this disclosure, unless otherwise specified in the claims.

Figure 3:
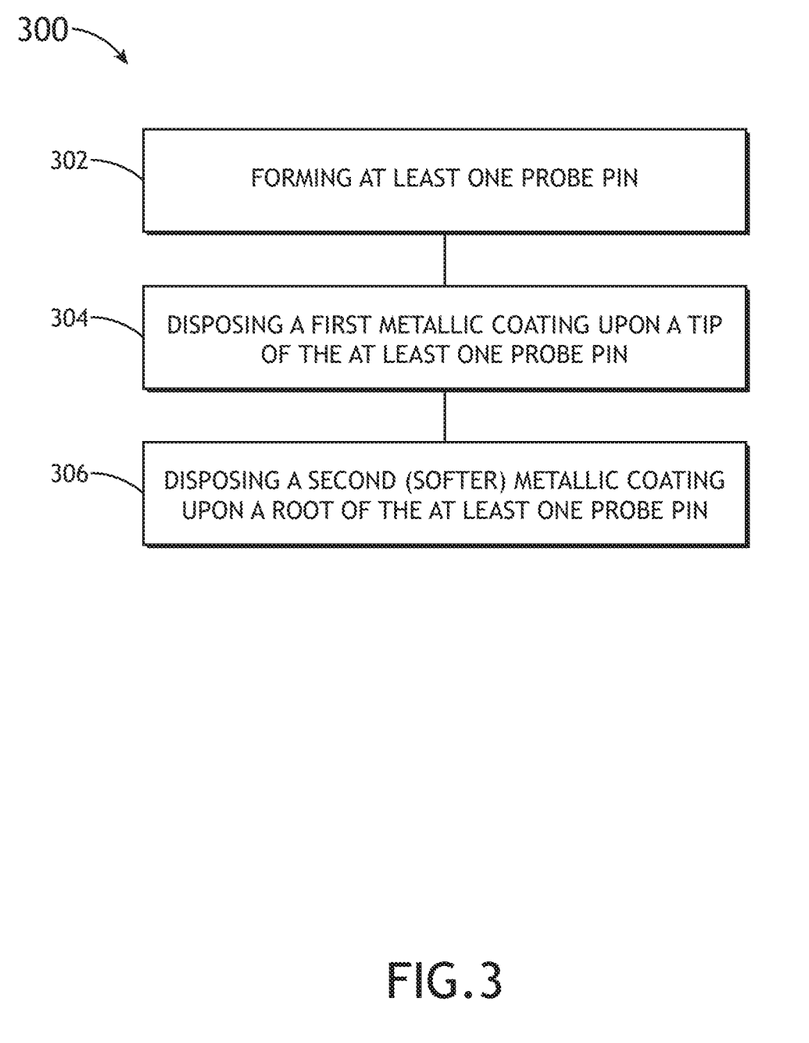
FIG. 3 is a flow diagram illustrating a method of manufacturing a cantilever-type probe with multiple metallic coatings, in accordance with one or more embodiments of the present disclosure.

FIG. 3 is a flow diagram illustrating a method 300 of manufacturing a cantilever-type probe (e.g., sensor 200) with multiple metallic coatings, in accordance with one or more embodiments of the present disclosure.

At step 302, the method 300 includes forming at least one probe pin 204 of the sensor 200. For example, one or more probe pins 204 may formed from (e.g., etched out of) a Si wafer and/or $SiO_2$ wafer, such as a SOI wafer, or the like. The one or more probe pins 204 may extend outwardly from a sensor base 202 that is also formed from (e.g., etched out of) a Si wafer and/or $SiO_2$ wafer, such as a silicon on insulator (SOI) wafer, or the like. In some embodiments, the sensor base 202 and the probe pins 204 may be formed from the same wafer and/or part of the same mold or print. In other embodiments, the probe pins 204 may be printed on, mounted to, or otherwise coupled with the sensor base 202.

At step 304, a first metallic coating 206A is disposed upon a tip of the probe pin 204. For example, the first metallic coating 206A (e.g., Ru, W, or the like) may be applied to the tip of the probe pin 204 by one or more lithography processes (e.g., sputtering and lift-off processes). In other embodiments, the first metallic coating 206A may be 3D printed onto the tip of the probe pin 204 or applied by any other appropriate manufacturing process.

At step 306, a second (softer) metallic coating 206B is disposed upon a root of the probe pin 204. For example, the second metallic coating 206B (e.g., Au, or the like) may be applied to the root of the probe pin 204 by one or more lithography processes (e.g., sputtering and lift-off processes). In other embodiments, the second metallic coating 206B may be 3D printed onto the root of the probe pin 204 or applied by any other appropriate manufacturing process.

At steps 304 and 306, the first metallic coating 206A and the second metallic coating 206B may be disposed upon the probe pin 204 so that the coatings are contact with one another at an overlapping region 207 near the tip of the probe pin 204. For example, the second metallic coating 206B may overlap a portion of the first metallic coating 206A so that the first and second metallic coatings 206A and 206B are in contact with one another at the overlapping region 207. Alternatively, the first metallic coating 206A may overlap a portion of the second metallic coating 206B so that the first and second metallic coatings 206A and 206B are in contact with one another at the overlapping region 207. In other embodiments, the first and second metallic coatings 206A and 206B may be in non-overlapping contact with one another. For example, the metallic coatings 206A and 206B may simply be disposed adjacent to one another or the metallic coatings 206A and 206B may be fused together (e.g., at/near region 207).

Method 300 may be extended to the manufacture of a sensor 200 including any number of probe pins 204. In general, the operations/steps of method 300 may be performed in an arbitrary order, unless otherwise specified in the claims.

FIGS. 4A through 4H schematically illustrate an embodiment of a manufacturing process steps/stages for a method (e.g., method 300) of manufacturing a cantilever-type probe (e.g., sensor 200) with multiple metallic coatings.

Figure 4A:
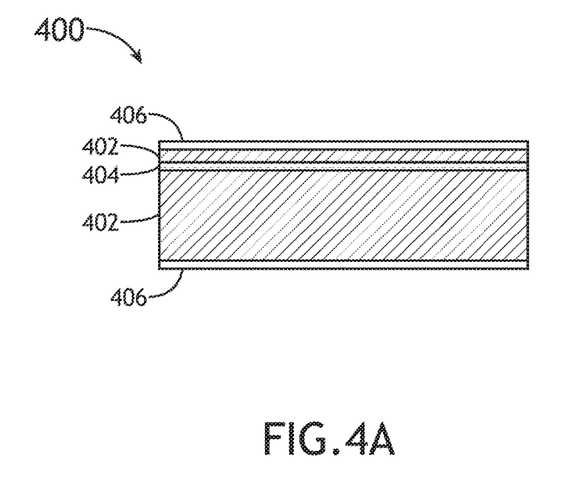
FIG. 4A is a schematic illustration of a process step in a method of manufacturing a cantilever-type probe with multiple metallic coatings, in accordance with one or more embodiments of the present disclosure.

FIG. 4A illustrates a semiconductor wafer 400 (e.g., a SOI wafer) after performing a low-pressure chemical vapor deposition (LPCVD) process that forms a silicon nitride ($Si_3N_4$) layer 406 on top and bottom surfaces of the wafer 400. In embodiments, the wafer 400 may include Si layers 402 separated by at least one oxide (e.g., $SiO_2$) layer 404.

Figure 4B:
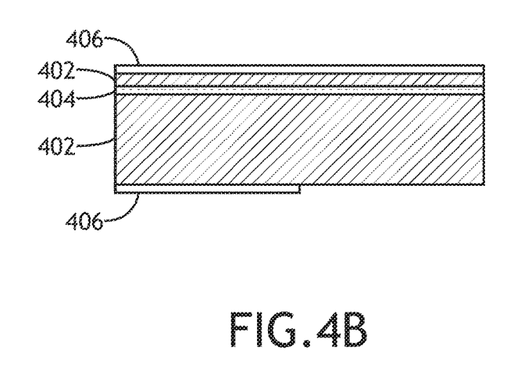
FIG. 4B is a schematic illustration of a process step in a method of manufacturing a cantilever-type probe with multiple metallic coatings, in accordance with one or more embodiments of the present disclosure.

FIG. 4B illustrates the semiconductor wafer 400 after performing at least one lithography process that forms an opening in the $Si_3N_4$ layer 406 at the bottom surface of the wafer 400. In some embodiments, the lithography process includes reactive-ion etching (RIE); however, any other appropriate lithography process may be employed.

Figure 4C:
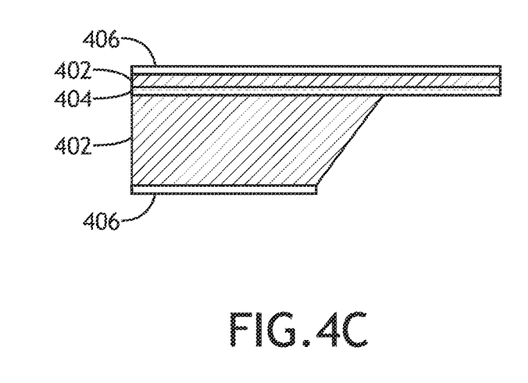
FIG. 4C is a schematic illustration of a process step in a method of manufacturing a cantilever-type probe with multiple metallic coatings, in accordance with one or more embodiments of the present disclosure.

FIG. 4C illustrates the semiconductor wafer 400 after performing at least one etching process that forms a portion of a probe pin 204 extending from a sensor base 202 by removing a portion of an Si layer 402 from the wafer 400. In some embodiments, the etching process includes potassium hydroxide (KOH) etching; however, any other appropriate etching process may be employed.

Figure 4D:
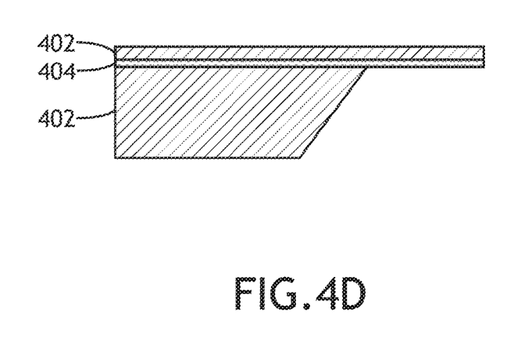
FIG. 4D is a schematic illustration of a process step in a method of manufacturing a cantilever-type probe with multiple metallic coatings, in accordance with one or more embodiments of the present disclosure.

FIG. 4D illustrates the semiconductor wafer 400 after performing at least one etching process that removes the remaining the $Si_3N_4$ layers 406 from the wafer 400. In some embodiments, the etching process includes phosphoric acid ($H_3PO_4$) etching; however, any other appropriate etching process may be employed.

Figure 4E:
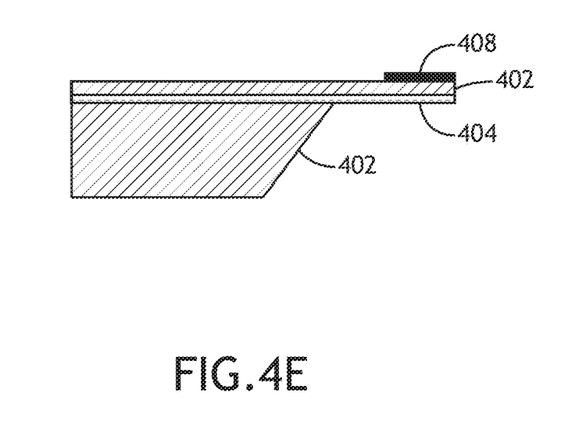
FIG. 4E is a schematic illustration of a process step in a method of manufacturing a cantilever-type probe with multiple metallic coatings, in accordance with one or more embodiments of the present disclosure.

FIG. 4E illustrates the semiconductor wafer 400 after performing at least one lithography process that forms a region for disposing a first metallic coating 408 (e.g., metallic coating 206A) at a tip of the probe pin 204 and a sputtering process for applying the first metallic coating 408 (e.g., metallic coating 206A) at the tip of the probe pin 204. In some embodiments, the sputtering process is followed by a lift-off process.

Figure 4F:
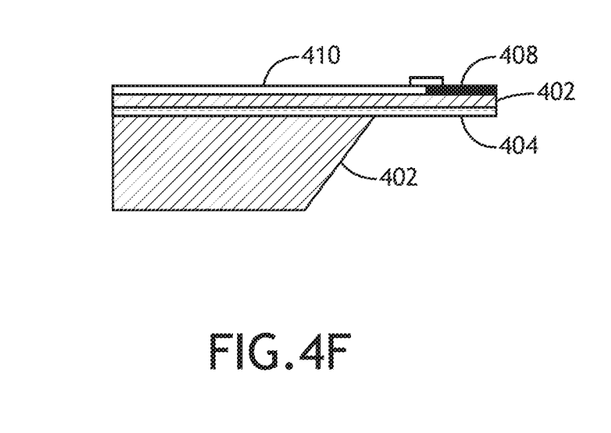
FIG. 4F is a schematic illustration of a process step in a method of manufacturing a cantilever-type probe with multiple metallic coatings, in accordance with one or more embodiments of the present disclosure.

FIG. 4F illustrates the semiconductor wafer 400 after performing at least one lithography process that forms a region for disposing a second metallic coating 410 (e.g., metallic coating 206B) at a root of the probe pin 204 and a sputtering process for applying the second metallic coating 408 (e.g., metallic coating 206B) at the root of the probe pin 204. In some embodiments, the sputtering process is followed by a lift-off process.

Figure 4G:
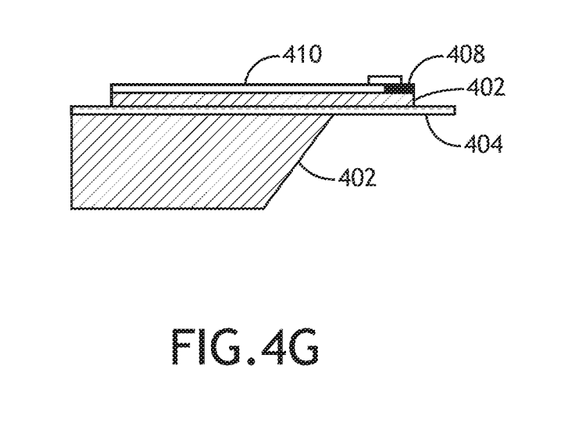
FIG. 4G is a schematic illustration of a process step in a method of manufacturing a cantilever-type probe with multiple metallic coatings, in accordance with one or more embodiments of the present disclosure.

FIG. 4G illustrates the semiconductor wafer 400 after performing one or more lithography processes that further define the shape of the probe pin 204 extending from the sensor base 202 by removing a portion of the Si layer 402, the first metallic coating 408 (e.g., metallic coating 206A), and the second metallic coating 410 (e.g., metallic coating 206B) from the wafer 400. In some embodiments, the lithography processes include ion beam etching (IBE) for the metallic coatings and RIE or deep reactive-ion etching (DRIE) for the Si layer 402; however, any other appropriate lithography/etching processes may be employed.

Figure 4H:
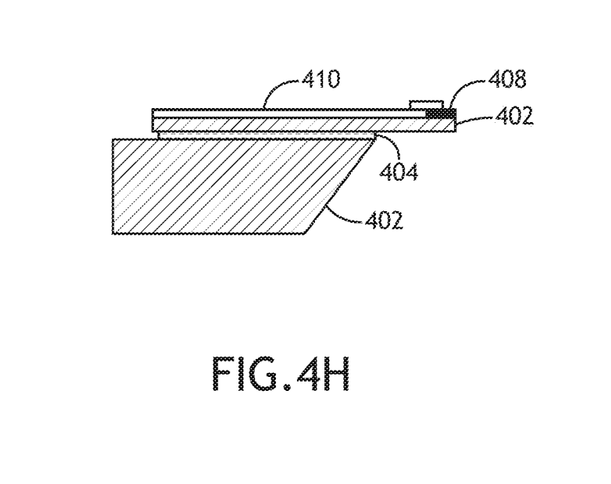
FIG. 4H is a schematic illustration of a process step in a method of manufacturing a cantilever-type probe with multiple metallic coatings, in accordance with one or more embodiments of the present disclosure.

FIG. 4H illustrates the semiconductor wafer 400 after performing another lithography/etching process (e.g., RIE or any other appropriate lithography/etching process) that further defines the shape of the probe pin 204 extending from the sensor base 202 by removing a portion of the oxide (SiO$_2$) layer 404 from the wafer 400. The resulting structure in FIG. 4H is a cantilever-probe, such as the sensor 200 described herein.

Figure 5:
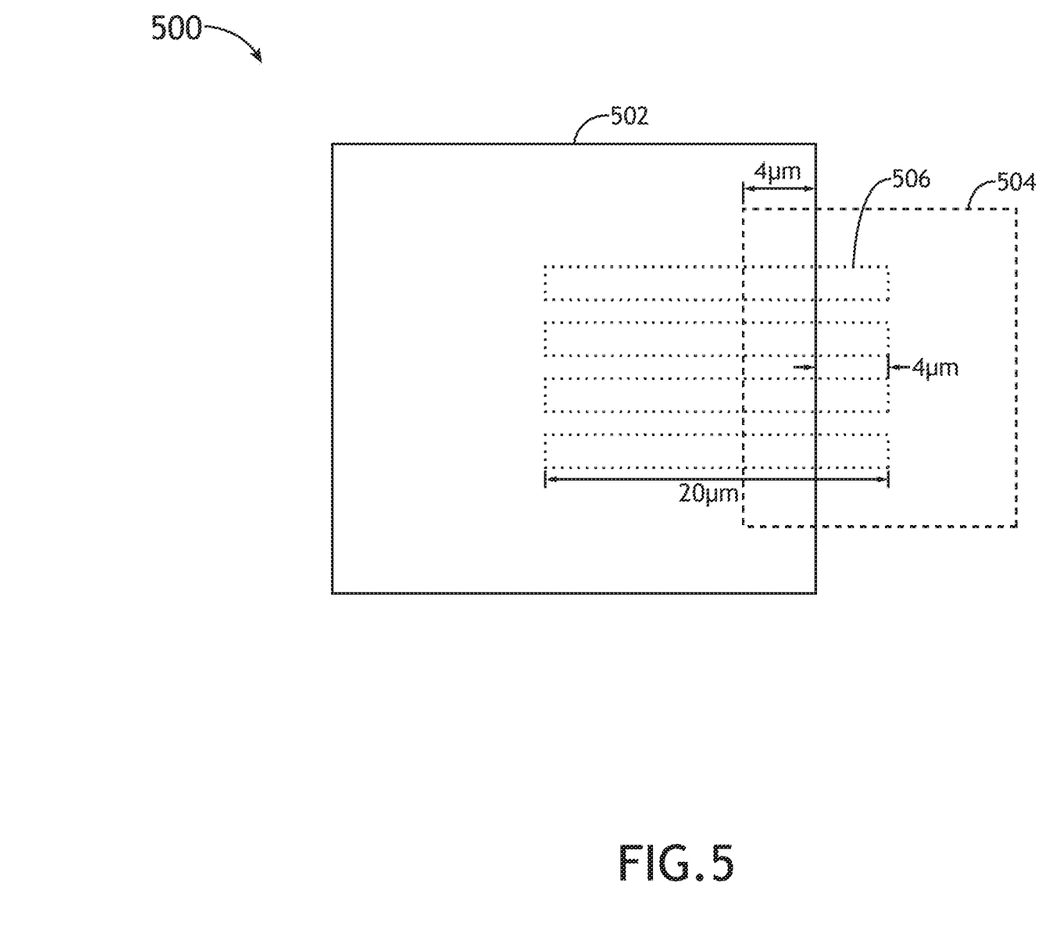
FIG. 5 is a schematic illustration of a mask for manufacturing a cantilever-type probe with multiple metallic coatings, in accordance with one or more embodiments of the present disclosure.

With reference to FIG. 5, at least one mask 500 may be used during one or more steps of method 300 and/or the process illustrated in FIGS. 4A through 4H. For example, the mask (or masks) 500 may include a probe pin stencil 506 for defining the one or more probe pins 204, a first metallic coating stencil 504 for defining the first metallic coating 206A at the tip of each probe pin 204, and a second metallic coating stencil 506 for defining the second metallic coating 206B at the root of each probe pin 204. The dimensions illustrated in FIG. 5 are provided as examples; however, any other dimensions may be employed without deviating from the scope of this disclosure.

As previously noted, the sensor 200 may have any number of probe pins 204 depending on design requirements. For example, FIG. 6 shows an illustrative embodiment where the sensor 200 is a microscopic twelve-point probe (M12PP). M12PP embodiments may be useful for magnetic tunnel junction (MTJ) wafer measurements, where the width of the probe pins 204 may be at least in the range of 0.5 to 1 um (e.g., at least 0.75 um). This is yet another illustrative embodiment of the sensor 200; however, it is emphasized that the sensor 200 may have an arbitrary number of (one or more) probe pins 204 without departing from the scope of this disclosure.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A cantilever-type probe for measuring one or more characteristics of a sample substrate, comprising:
   at least one probe pin;
   a first metallic coating disposed upon a tip of the at least one probe pin, wherein the first metallic coating comprises at least one of tungsten or ruthenium; and
   a second metallic coating disposed upon a root of the at least one probe pin, wherein the second metallic coating is contiguous with the first metallic coating and wherein a portion of the second metallic coating extends above the first metallic coating in an overlap region, and wherein the second metallic coating comprises a softer metal than the first metallic coating.

2. The cantilever-type probe of claim 1, wherein the at least one probe pin comprises at least one of silicon (Si) or silicon dioxide (SiO$_2$).

3. The cantilever-type probe of claim 1, wherein the second metallic coating comprises gold (Au).

4. The cantilever-type probe of claim 1, wherein the cantilever-type probe is configured to measure at least one film resistance characteristic of the sample substrate.

5. A sensor for measuring one or more characteristics of a sample substrate, comprising:
   a sensor base;
   a plurality of probe pins extending from the sensor base;
   a first metallic coating disposed upon a tip of at least one probe pin of the plurality of probe pins, wherein the first metallic coating comprises at least one of tungsten or ruthenium; and
   a second metallic coating disposed upon a root of the at least one probe pin, wherein the second metallic coating is contiguous with the first metallic coating and wherein a portion of the second metallic coating extends above the first metallic coating in an overlap region, and wherein the second metallic coating comprises a softer metal than the first metallic coating.

6. The sensor of claim 5, wherein the sensor base and the plurality of probe pins comprise at least one of silicon (Si) or silicon dioxide (SiO$_2$).

7. The sensor of claim 5, wherein the second metallic coating comprises gold (Au).

8. The sensor of claim 5, wherein the sensor is a cantilever-type probe.

9. The sensor of claim 5, wherein the sensor is a microscopic four-point probe or a microscopic twelve-point probe.

10. The sensor of claim 5, wherein the sensor is configured to measure at least one film resistance characteristic of the sample substrate.

11. A method of manufacturing a cantilever-type probe, comprising:
    forming at least one probe pin;

disposing a first metallic coating upon a tip of the at least one probe pin, wherein the first metallic coating comprises at least one of tungsten or ruthenium; and disposing a second metallic coating upon a root of the at least one probe pin, wherein the second metallic coating is contiguous with the first metallic coating and wherein a portion of the second metallic coating extends above the first metallic coating in an overlap region, and wherein the second metallic coating comprises a softer metal than the first metallic coating.

12. The method of claim 11, wherein the at least one probe pin is formed by etching a silicon on insulator (SOI) wafer.

13. The method of claim 11, wherein the at least one of tungsten or ruthenium is disposed upon the tip of the at least one probe pin by performing sputtering and lift-off processes.

14. The method of claim 11, wherein the second metallic coating comprises gold (Au) disposed upon the tip of the at least one probe pin by performing sputtering and lift-off processes.

* * * * *